United States Patent [19]

Betti et al.

[11] Patent Number: 5,034,706

[45] Date of Patent: Jul. 23, 1991

[54] VOLTAGE-CONTROLLED VARIABLE OSCILLATOR, IN PARTICULAR FOR PHASE-LOCK LOOPS

[75] Inventors: Giorgio Betti; Maurizio Zuffada, both of Milan, Italy

[73] Assignee: SGS-Thomson Microelectronics S.r.l., Agrate Brianza, Italy

[21] Appl. No.: 559,799

[22] Filed: Jul. 30, 1990

[30] Foreign Application Priority Data

Aug. 7, 1989 [IT] Italy ............................... 21462 A/89

[51] Int. Cl.$^5$ ............................................ H03B 5/12
[52] U.S. Cl. .................................. 331/117 R; 331/34; 331/168; 331/177 R
[58] Field of Search ........ 331/117 R, 117 FE, 116 K, 331/116 FE, 168, 177 R, 34

[56] References Cited

U.S. PATENT DOCUMENTS 3,963,996 6/1976 Skerlos ........................... 331/117 R Primary Examiner—Siegfried H. Grimm
Attorney, Agent, or Firm—Guido Modiano; Albert Josif

[57] ABSTRACT

A voltage-controlled variable oscillator, in particular for phase-lock loops, comprising a differential stage formed by a pair of transistors and collectors whereof define the output terminals between which an external resonating circuit is connected, a voltage generator which is connected between the two output terminals and is suitable for generating a voltage which is proportional to the terminal voltage which exists across the resonating circuit, and a pair of capacitors connected between a respective output terminal and the voltage source.

6 Claims, 1 Drawing Sheet

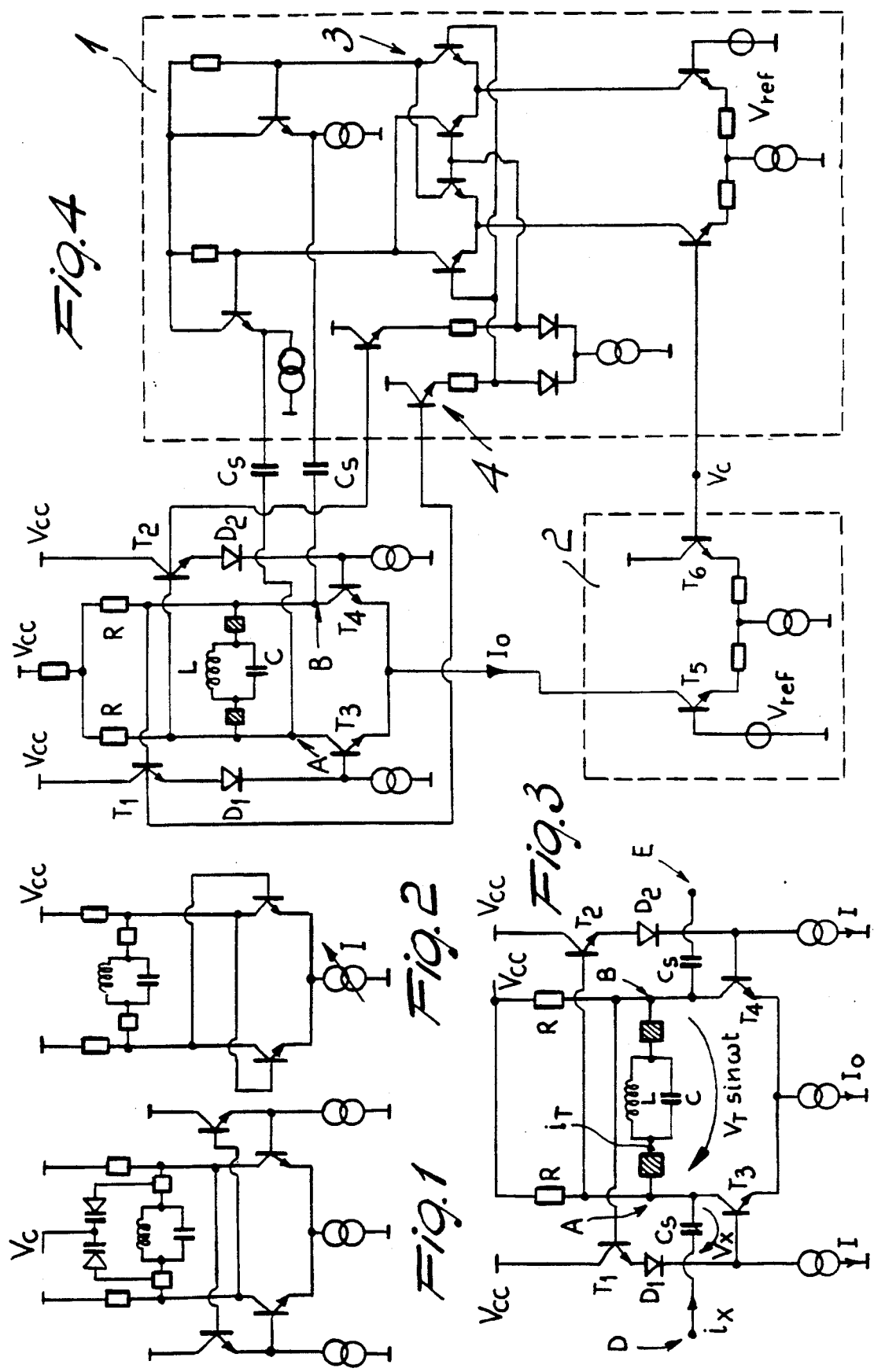

VOLTAGE-CONTROLLED VARIABLE OSCILLATOR, IN PARTICULAR FOR PHASE-LOCK LOOPS

BACKGROUND OF THE INVENTION

The present invention relates to a voltage-controlled variable oscillator, in particular for phase-lock loops.

As is known, a voltage-controlled oscillator (VCO) is an oscillator the frequency whereof varies according to the variation of an externally applied voltage. Said variable oscillators are extensively used in phase-lock loops (PLL), for example for conversion to video medium frequency. In particular, integratable variable oscillators, with a central frequency of 38.9 MHz and a variation interval of ±500 KHz, are currently required for this application. The oscillator is furthermore required to provide a signal which must be as stable as possible in terms of frequency and peak-to-peak value as the temperature and the process parameters vary.

In order to obtain the variability of the operating frequency, all current circuits use a capacitor in resonance with a fixed inductance. A known solution (shown in FIG. 1) has voltage-controlled varactors connected in parallel to the resonating circuit. These varactors can be internal or external to the integrated circuit; however, the integration of these varactors has problems in high-speed processes since generally they cannot be integrated conveniently. On the other hand, the use of external components necessarily entails a more complicated application which in some cases is therefore undesirable.

Another known solution provides the use of current-controlled saturation capacitors obtained within an integrated circuit (see FIG. 2). According to this solution, by varying the current I, it is possible to directly bias the collector junctions of the transistors, thus modulating the equivalent capacity of the transistors themselves. However, this solution, despite being easily integratable, has numerous disadvantages related to the fact that the peak-to-peak output value depends on the operating frequency, the output frequency depends on the process parameters (e.g. on the inverse transit time) and the output characteristics depend on the temperature (through the saturation characteristics of the transistors).

SUMMARY OF THE INVENTION

Given this situation, the aim of the present invention is to provide a voltage-controlled variable oscillator, in particular for phase-lock loops, which is capable of solving the disadvantages of the state of the art.

Within the scope of this aim, a particular object of the present invention is to provide a variable oscillator which can provide a signal which is stable in terms of frequency and of peak-to-peak value as the temperature and process parameters vary.

An important object of the present invention is to provide a variable oscillator which can be easily integrated.

This aim, the objects mentioned and others which will become apparent hereinafter are achieved by a voltage-controlled variable oscillator, in particular for phase-lock loops, as defined in the appended claims.

BRIEF DESCRIPTION OF THE DRAWINGS

The characteristics and advantages of the invention will become apparent from the description of a preferred embodiment, illustrated only by way of non-limitative example in the accompanying drawings, wherein:

FIG. 1 is an electric diagram of a known solution;

FIG. 2 is an electric diagram of another known solution;

FIG. 3 is an electric diagram of a part of the circuit according to the invention; and FIG. 4 is a complete electric diagram of the oscillator according to the invention.

DESCRIPTION OF THE PREFERRED EMBODIMENTS lo With reference to FIG. 3, L and C respectively indicate the coil and the capacitor which constitute the external resonating circuit, which has a terminal voltage equal to $$V_T \sin(wt).$$

The integrated circuit provided for driving the external resonating circuit comprises a differential stage which includes a pair of transistors $T_3$ and $T_4$, the collectors whereof are connected to the power supply $V_{CC}$ by means of respective resistors R. The collectors of the two transistors $T_3$ and $T_4$ are furthermore connected to the two output bump contacts for connection to the external resonating circuit. There are two feedback circuits, formed by the transistor $T_1$ and by the diode $D_1$ and respectively by the transistor $T_2$ and by the diode $D_2$, interposed between the collector of one of the transistors $T_3$ or $T_4$ and the base of the other transistor $T_4$ or $T_3$. The feedback circuits $T_1$, $D_1$ and $T_2$, $D_2$ ensure that the collector of the transistors $T_3$ and $T_4$ never drops below the voltage of the respective bases and that therefore these transistors never saturate. The circuit is completed by the current generator $I_0$, connected to the joined emitters of the transistors $T_3$ and $T_4$, and the current generators I, which are connected to the bases of the transistors $T_3$ and $T_4$. Two capacitors $C_s$ are furthermore connected with one terminal to the collector of the transistors $T_3$ and $T_4$. According to the invention, a fraction K of the potential difference which occurs between the two output terminals (and therefore occurs across the terminals of the external resonating circuit) is applied to the other two terminals of the capacitors $C_s$.

At the points A and B therefore there is a voltage which is respectively equal to $$\frac{V_T}{2} \sin(\omega t) \text{ and } -\frac{V_T}{2} \sin(\omega t)$$

whereas at the points D and E the voltage is respectively equal to $$K \frac{V_T}{2} \sin(\omega t) \text{ and } -K \frac{V_T}{2} \sin(\omega t)$$

The current in the external resonating circuit $i_T$ is given by $$i_T = G_T \cdot V_T \cos(\omega t) \quad (1)$$

where $G_T$ is the load impendance given by:

$$G_T = \left( \omega C - \frac{1}{\omega L} \right) \quad (2)$$

If $V_x$ is the voltage on the terminals of the capacitor $C_s$ connected to the collector of $T_3$, from the figure it can be immediately seen that $$V_x = (K - 1) \frac{V_T}{2} \sin(\omega t) \quad (3)$$

Since the current for a capacitor is given by $$i = C \frac{dv}{dt}$$

the current in $C_s$ is $$i_x = C_s \omega (K - 1) \frac{V_T}{2} \cos(\omega t). \quad (4)$$

When the differential of the oscillator is balanced, the following must be true:

$$i_x = i_T \quad (5)$$

and $$V_T \sin(\omega t) = 0 \quad (6)$$

By replacing (1) and (4) in (5), the following is obtained:

$$C_s \omega (K - 1) \frac{V_T}{2} \cos(\omega t) = \left( \omega C - \frac{1}{\omega L} \right) V_T \cos(\omega t). \quad (7)$$

From (6), $\cos(\omega t) = 1$ and can be simplified.
By solving with respect to $\omega$, the following is obtained:

$$\omega = \frac{1}{\sqrt{L \left[ C + \frac{C_s}{2} (1 - K) \right]}} \quad (8)$$

and consequently by varying K it is possible to vary the oscillator's operating frequency.

If for example one chooses L=360.77 nanoHenry, C=45 picoFarad and $C_s$=2.864 picoFarad, the oscillation frequency assumes the values comprised between 38.3 megahertz and 39.5 megahertz for K variable between $-1$ and 1.

The factor K can be obtained by means of a linear multiplier, for example provided as a Gilbert multiplier. The complete solution with the Gilbert multiplier is thus shown in FIG. 4, wherein it is possible to identify, besides the diagram already shown in FIG. 3, the block 1, which indeed constitutes the linear multiplier (which is not described in detail, since it is well-known, and substantially comprises a Gilbert multiplier 3 and a voltage/current converter 4 interposed between the actual multiplier 4 and the points A and B) and a bias current adjustment block 2. In FIG. 4, $V_c$ indicates the external oscillation frequency control voltage.

The block 2, which is substantially constituted by a differential stage formed by the transistors $T_5$ and $T_6$, which have emitter resistors and respectively receive, on their bases, a reference voltage $V_{ref}$ and the external control voltage $V_c$, is advantageously provided in order to keep the peak-to-peak value of the oscillation constant. As can be seen from (2), the load impedance $G_T$ in fact depends on the frequency and more precisely the absolute value of the load impendance $G_T$ decreases as the operating frequency decreases. By increasing the bias current $I_o$ of the differential of the oscillator, its transconductance gain is thus increased, so that the total loop gain of the circuit is kept substantially constant.

As can be seen from the preceding description, the invention achieves the proposed aim and objects. A variable oscillator (VCO) has in fact been provided which can be easily integrated (the capacity values required for $C_s$ are widely compatible with those which can be obtained by integrated capacitors) and is such as to be extensively independent of process parameter variations and of temperature variations.

As can be seen from (8), the set frequency depends in fact only on the external components (L and C), on the integrated capacitors $C_s$ (which can be provided with good precision) and on the factor K, which can be controlled satisfactorily since it is set by means of a linear multiplier.

The extreme symmetry of the circuit, which contributes to a reduction in sensitivity to manufacturing process spreads, is also stressed.

Furthermore, by virtue of the feedback circuit $T_1$, $D_1$ and $T_2$, $D_2$ which prevents the transistors $T_3$ and $T_4$ of the differential stage from saturating, possible stray capacitances are reduced, thus providing greater insensitivity to process parameters.

Computer simulations have shown that the output sinusoid has a distortion of less than 5 per mille, using the exemplifying values indicated above. Temperature sensitivity is of the following order of magnitude:

$$\frac{1}{f_o} \frac{\partial f_o}{\partial T} \simeq 50/\text{ppm (parts per million)}$$

It has been observed that even a 10% spread between the capacitors $C_s$ gives rise to an extremely modest variation in the operating frequency.

Relative sensitivity is of the following order of magnitude:

$$\frac{1}{f_o} \frac{\partial f_o}{\partial C_s} \simeq 30 \text{ ppm/spread percentage point}$$

The invention is furthermore conceptually simple and highly reliable.

The invention thus conceived is susceptible to numerous modifications and variations, all of which are within the scope of the inventive concept.

All the details may furthermore be replaced with other technically equivalent ones.

We claim:

1. Voltage-controlled variable oscillator, in particular for phase-lock loops, comprising a differential stage formed by a pair of transistors which have collector terminals which define output terminals suitable for connection to a resonating circuit, wherein it comprises a voltage generator which is connected to at least one of said output terminals and is suitable for generating a voltage which is proportional to the terminal voltage which exists across said resonating circuit and a capacitor which is connected with one of its terminals to one of said output terminals and with its other terminal to said voltage generator.

2. Oscillator according to claim 1, wherein said voltage generator is constituted by a Gilbert multiplier.

3. Oscillator according to claim 2, comprising a pair of capacitors, each of which is connected with one terminal to a respective output terminal and with the other terminal to the outputs of said Gilbert multiplier.

4. Oscillator according to claim 1, comprising a pair of feedback circuits interposed between the collector terminal of one of said transistors of said differential stage and the base terminal of the other transistor.

5. Oscillator according to claim 1, comprising a variable current generator which is connected to the emitter terminals of said transistors of said differential stage to vary the bias current of said differential stage as the operating frequency of the resonating circuit varies.

6. Oscillator according to claim 5, wherein said variable current generator comprises a differential stage which has as inputs a reference voltage and the oscillator's control voltage.

* * * * *